United States Patent [19]

Singh Deo et al.

[11] Patent Number: 5,263,242
[45] Date of Patent: Nov. 23, 1993

[54] METHOD OF MAKING SEMICONDUCTOR PACKAGE WITH SEGMENTED LEAD FRAME

[75] Inventors: Narendra N. Singh Deo; Alexander H. C. Chang, both of San Jose, Calif.

[73] Assignee: CN Industries Ltd., Santa Clara, Calif.

[21] Appl. No.: 258

[22] Filed: Jan. 4, 1993

Related U.S. Application Data

[62] Division of Ser. No. 696,498, May 7, 1991.

[51] Int. Cl.$^5$ ............................................. H01R 43/00
[52] U.S. Cl. ...................................... 29/827; 174/52.4; 437/209
[58] Field of Search ......................... 29/827; 174/52.4; 437/209

[56] References Cited

U.S. PATENT DOCUMENTS

| | | | |
|---|---|---|---|
| 3,832,480 | 8/1974 | Bunker | 174/52.4 X |
| 4,148,161 | 12/1979 | Henrickson et al. | 174/52.4 X |
| 4,214,364 | 7/1980 | St. Louis et al. | 29/827 |
| 4,461,924 | 7/1984 | Butt | 174/52.4 |
| 4,514,750 | 4/1985 | Adams | 174/52.4 X |
| 4,568,796 | 2/1986 | Lebailly et al. | 174/52.4 X |
| 5,014,418 | 5/1991 | Wright | 29/827 |

FOREIGN PATENT DOCUMENTS

| | | | |
|---|---|---|---|
| 53-25360 | 3/1978 | Japan | 29/827 |
| 60-223147 | 11/1985 | Japan | 29/827 |
| 2178894 | 2/1987 | United Kingdom | 29/827 |

*Primary Examiner*—Carl J. Arbes
*Attorney, Agent, or Firm*—Michael J. Hughes

[57] ABSTRACT

An improved semiconductor package (10) having a segmented lead frame (14) and (514) is disclosed. The preferred segmented lead frame (14) is divided into essentially identical segments (27) which have planes (22) attached to at least some of the associated individual leads (28). Segmentation of the lead frame (14) allows for the use of planes in inexpensive plastic and ceramic packages. Segmentation further allows the use of inexpensive aluminized stripes (42) to aluminize portions of individual leads (28) even in quad package configurations. An alternate equally preferred segmented lead frame (514) is provided for those applications wherein asymmetrical lead frames are required. Segmentation of the alternate segmented lead frame (514) permits the use of planes (522) and (552), while also limiting the cost of producing the alternate lead frame (514) especially when the etching method of production is required.

4 Claims, 5 Drawing Sheets

METHOD OF MAKING SEMICONDUCTOR PACKAGE WITH SEGMENTED LEAD FRAME

This is a continuation of copending application Ser. No. 07/696,498 filed on May 7, 1991.

TECHNICAL FIELD

The present invention relates generally to the packaging of semiconductor devices which are subsequently mounted on printed circuit boards and more particularly to improvements relating to efficiency in the manufacture of high lead density components. The predominant current usage of the segmented lead frame packages of the present invention is as a means to reduce the cost of housing semiconductor devices such as ASICs (application specific integrated circuits) and the like, while retaining reliability levels formerly attained only through the use of more expensive packaging techniques.

BACKGROUND ART

There exists today a need to provide semiconductor packages which have a very great number of leads but which are also of a very small overall size. Packages manufactured using the well known ceramic multilayer co-fired technology are presently capable of the greatest lead density. Furthermore, ceramic multilayer co-fired packages can also provide the additional benefit of having ground and power planes and the attendant advantages thereof. However, ceramic multilayer co-fired packages are prohibitively expensive except for applications which can command an extremely high price, such as in the construction of devices which must meet military specifications.

Lead count density of less expensive packages, such as plastic or cerdip packages, is limited by the number of lead fingers which can be attached at the die cavity (the smallest area in the package at which leads must be attached). Co-fired packages also face similar limitations as to the quantity of leads which can be attached at a die cavity, but this limitation is overcome by the fact that the co-fired technology allows for providing more than one tier of bonding locations at the die cavity perimeter.

Recent advances in techniques for etching or stamping lead frames has allowed lead frame tips of less than 0.015 cm (0.006 in) to be produced thus providing, at the extreme, lead counts even exceeding 400 with a conventional die cavity size and configuration. However, these advances alone will still not always provide the lead densities required in many present and future applications. Furthermore, lead frames having such high lead counts require very expensive dies if they are to be produced by stamping. Indeed, the tooling cost for such lead frames is often so expensive that it is only practical to produce them by the etching process, even though the per piece cost is much greater than can be achieved using stamping methods.

Another factor affecting the cost of semiconductor packaging is the fact that lead frames must often be treated with a non-oxidizing substance, such as gold, or with a minimally oxidizing metal, such as aluminum, at their die cavity ends to allow attachment of connection interconnecting wires by conventional interconnection methods, such as aluminum ultrasonic bonding, gold thermo-sonic bonding or TAB (tape automated bonding). For DIP (dual in line packages), this can be accomplished by stamping the lead frames from a metal strip or coil having an aluminized stripe running at its center. However, for quad packs this method cannot be used, since the aluminized stripe on the web would necessarily run through two of the four sides of any lead frame stamped from such material. Today, four sided lead frames are stamped from non-aluminized material, and then aluminum is vapor deposited on only the lead tip areas, at a considerably greater cost.

Obviously, it would be desirable to produce a package which could incorporate the advantages of a very high lead count and the possibility of inclusion of voltage and ground planes at a cost substantially below that of co-fired packages. Even more benefit could be derived if such packages could utilize lead frames which could be stamped using less expensive dies than those normally used, and which could be stamped from material on which an aluminum layer was coextruded or vapor deposited in a high volume manufacturing process, thus eliminating a need for the expensive process of vapor aluminizing the lead frame bond tips after they are stamped. Alternatively, if it is decided to produce the lead frames by etching, it would be advantageous if more frames could be produced per sheet, since the bulk of costs associated with etching are accrued on a per sheet basis.

All of the prior art semiconductor packages within the inventors' knowledge have required extremely expensive packaging styles to reliably produce very high lead densities which are capable of meeting the necessary stringent electrical parametric requirements, such as low inductance of conductor traces, low resistance of conductor traces, and appropriate shielding of voltage lines.

No prior art semiconductor package to the inventors' knowledge has successfully combined very high lead densities with reliability and economy of manufacture. All successful applications to date have either utilized the very expensive ceramic co-fired technology to achieve high lead count density, or else have not provided ground and power planes and have been capable of having the lead density available with ceramic co-fired packages.

DISCLOSURE OF INVENTION

Accordingly, it is an object of the present invention to provide a semiconductor package which can provide very high lead count densities.

It is another object of the present invention to provide a semiconductor package which utilizes lead frames which can be stamped using relatively low cost dies.

It is still another object of the present invention to provide a semiconductor package which utilizes lead frames which can be etched at a relatively low cost per piece.

It is yet another object of the present invention to provide a four sided semiconductor package which utilizes lead frames which can be stamped from material having a coextruded or evaporated aluminized portion.

It is still another object of the present invention to provide a semiconductor package which includes voltage and ground planes.

Briefly, the preferred embodiment of the present invention is a semiconductor package having a lead frame produced in segments instead of as a whole. A first preferred embodiment of the invention utilizes a lead frame divided into identical segments such that a symmetrical lead frame is produced upon the joining of the segments. Voltage and ground planes are provided, according to the present invention, by producing the planes as an extension of the lead frame. Since a majority of lead frames are symmetrical it is thought that this configuration will be readily accepted, as the advantages of voltage and ground planes in very high speed devices is well understood. Aluminized lead frame ends are provided by stamping the segments from a material strip having a coextruded aluminum stripe thereon. In the presently preferred embodiment of the invention, this aluminum stripe is wider than is common, thus providing the additional benefit of enhancing the seal between the lead frame and package materials.

Additional characteristics of the present invention are the addition of auxiliary alignment points and alignment grooves to facilitate proper alignment of the lead frame segments, and the layering of glass between the voltage and ground planes. The best presently known embodiment of the invention also includes lead forming bumps integral to a ceramic base for aiding in the bending of "J" formed leads without unduly stressing the glass/lead frame interface.

An equally preferred alternate embodiment of the segmented lead frame is an asymmetrical lead frame which has provisions for voltage and ground planes which are formed from the same section of lead frame material as is the lead frame proper.

An advantage of the present invention is that high lead count densities can be had with relatively little expense.

A further advantage of the present invention is that tooling cost can be greatly reduced for stamped lead frames.

Yet another advantage of the present invention is that costs for aluminizing lead frame tips in four sided packages is greatly reduced.

Still another advantage of the present invention is that voltage and ground planes are provided in an inexpensive package.

Yet another advantage of the present invention is that complex lead frames, including voltage and ground planes, can be etched using a minimum amount of material and at minimum expense.

Still another advantage of the present invention is that the segmented lead frames with voltage and ground plane can be attached with a glass, and further that they can be used in very inexpensive plastic packages.

These and other objects and advantages of the present invention will become clear to those skilled in the art in view of the description of the best presently known modes of carrying out the invention and the industrial applicability of the preferred embodiments as described herein and as illustrated in the several figures of the drawing.

BEST MODE FOR CARRYING OUT INVENTION

The best presently known mode for carrying out the invention is a four sided cerquad type semiconductor package having a lead frame formed in segments and including voltage and ground planes. The predominant expected usage of the inventive segmented lead frame package is in the semiconductor industry, particularly in the production of high speed complex integrated circuits wherein both reliability and economy are desirable.

Figure 1:
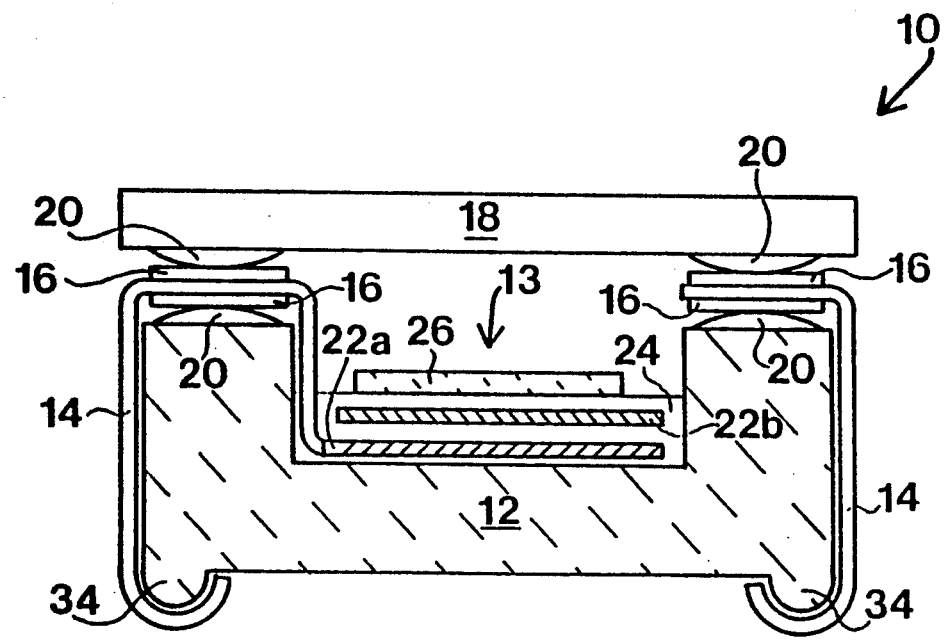
FIG. 1 is a cross sectional elevational view of an improved cerdip semiconductor package having a segmented lead frame, according present invention.

The improved semiconductor package with segmented lead frame of the presently preferred embodiment of the present invention is illustrated in a cut away elevational view in FIG. 1 and is designated therein by the general reference character 10. In many of its substantial components, the segmented lead frame semiconductor package 10 does not differ significantly from conventional semiconductor packages. The physical structure is similar to that of prior art conventional cerquad lead packages. It should be noted that, while the best presently known embodiment of the invention is a cerquad type package, the improvements of the present invention are equally applicable to plastic and other inexpensive type semiconductor packaging techniques. Similarly, the inventive improvements are not limited by the shape or configuration of the package, being equally applicable to DIP configurations and the like, as well.

The improved package 10 has a ceramic body 12 with a conventional well cavity 13 therein, a lead frame 14 having aluminized portions 16 as depicted in FIG. 1 and a top 18. Sealing glass 20 forms the junctions between the body 12, the lead frame 14 and the top is. While the top is and the sealing glass 20 are conventional in nature, difference between a conventional ceramic body (not shown) and the ceramic body 12 exist and will be discussed hereinafter. Furthermore, the inventive lead frame 14 differs from a conventional lead frame (not shown) as will be discussed hereinafter.

The best presently known embodiment 10 of the invention also has two planes 22 herein designated as a first plane 22a and a second plane 22b separated by a glass insulating material 24 which partially surrounds and separates the planes 22a and 22b as illustrated in the view of FIG. 1. It should be noted that the term "plane" is used herein to denote either a voltage or power plane or a ground plane or any such plane, and further that, for the purposes of this application, the term "voltage plane" may be used to designate any such "plane" even when, in application, the "plane" is used as a ground plane of for another purpose. As one skilled in the art will appreciate, the actual potential to be applied to the planes 22a and 22b in a particular application is not relevant to the inventive construction. The planes 22a and 22b are not unlike conventional voltage planes or ground planes (not shown) such as are used in packages constructed using the ceramic co-fired process. However, prior to the advent of the present invention, it has been thought that the planes 22a and 22b could not be incorporated into less expensive packages such as the cerquad package 10, or into the even less expensive plastic package (not shown). As will be disclosed hereinafter, the present invention is certainly not limited to a quantity of two planes 22a and 22b, and that quantity is used herein to illustrate the best presently known embodiment 10 of the invention as an example of one application only. Also shown in the view of FIG. 1 is a ceramic pad 26 for attachment of a semiconductor die (not shown). The semiconductor die (not shown) and any interconnecting leads (not shown) between the semiconductor die and the lead frame 14 are entirely conventional in nature and are omitted from the view of FIG. 1 for the sake of clarity.

Figure 2:
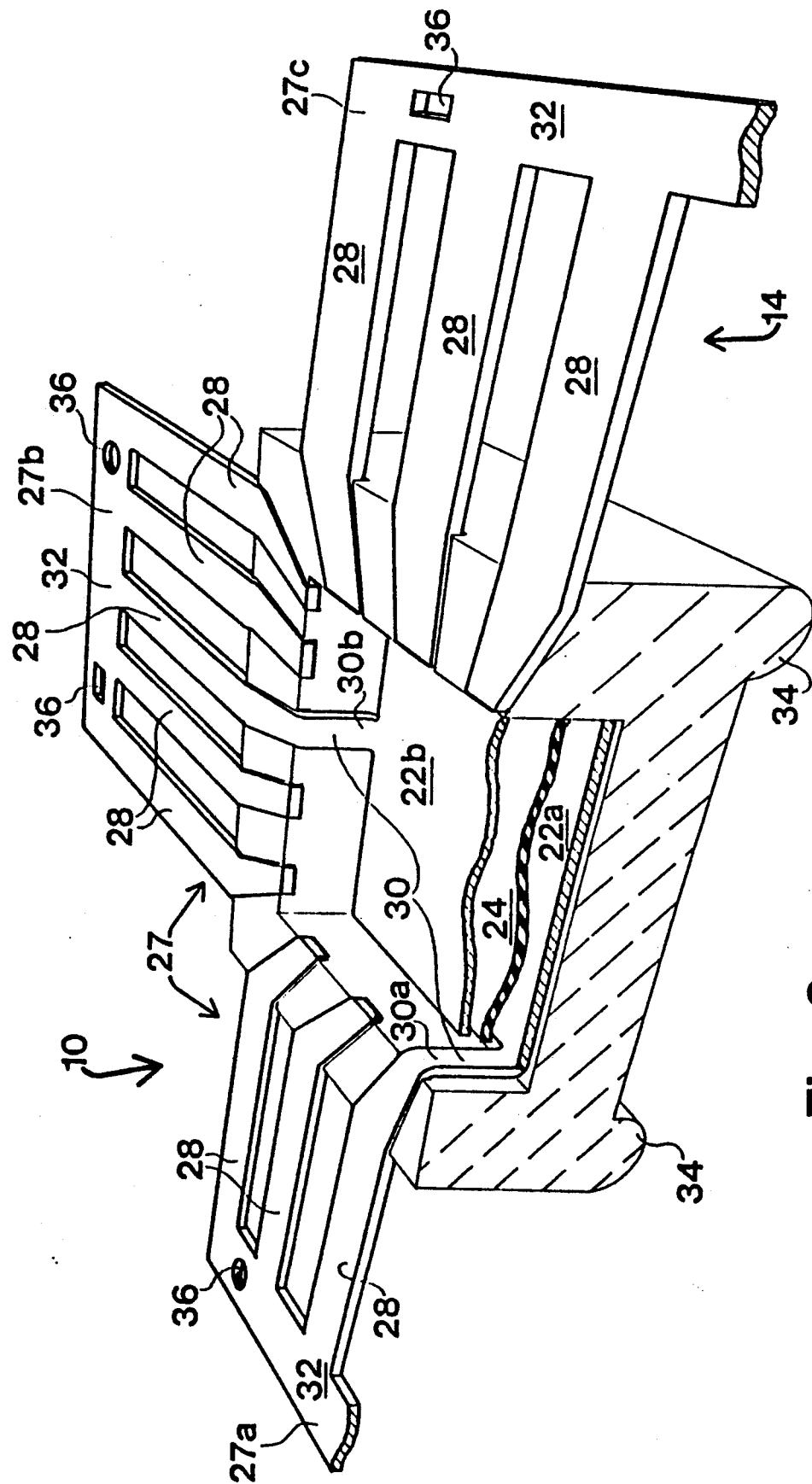
FIG. 2 is a cut away perspective view of the best presently known embodiment of the invention showing the package in a assembled condition.

FIG. 2 is a cut away perspective view of the best presently known embodiment 10 of the invention showing the package 10 in a partially assembled condition. As can be seen in the view of FIG. 2, the lead frame 14 is divided into a plurality of lead frame segments 27 (in this case four, of which three are visible in the view of FIG. 2, those being a first lead frame segment 27a, a second lead frame segment 27b and a third lead frame segment 27c). A fourth lead frame segment (not shown), which is not visible in the cut away view of FIG. 2, is provided to complete the quad configuration in the actual physical embodiment of the invention. In the view of FIG. 2, the second lead frame segment 27b is shown complete, while the first lead frame segment 27a and the third lead frame segment 27c are shown partially cut away. In the best presently known embodiment 10 of the invention, as illustrated in FIG. 2, each of the complete lead segments 27a, 27b and 27c has five individual leads 28. Of course, the present invention is not limited to having that quantity of leads 28. In an actual physical embodiment of the invention, each of the lead frame segments 27 might contain more than one hundred individual leads 28.

Also shown in the view of FIG. 2 are two lead frame extensions 30. The first lead frame 27a is connected to the first plane 22a by a first lead frame extension 30a, and the second lead frame 27b is connected to the second plane 22b by a second lead frame extension 30b. The leads 28 of each of the lead frame segments 27a, 27b and 27c are held together by a lead joining strip 32. In the view of FIG. 2 the lead joining strip 32 is shown still attached to the leads 28. However, as one skilled in the art will recognize, the lead joining strip 32 is cut off after the lead frames 27a, 27b and 27c are installed in the ceramic body 12.

The completed presently preferred embodiment 10 of the invention has the leads 28 bent into what is referred to as "J" configuration, as is depicted in FIG. 1. The ceramic body 12 of the present invention has molded thereon a "J" forming ridge 34 around which the leads 28 are bent after the lead joining strip 32 is removed, although it is certainly within the scope of the invention to form the leads into other configurations, such as "gull wing". Since the ceramic body 12 is manufactured using inexpensive custom molds, the addition of the "J" forming ridge does not add significantly to the cost. The "J" forming ridge 34 is unique to the present invention and is particularly useful in combination with the segmented lead frame 14 of the present invention, as the "J" forming ridge 34 aids in maintaining the alignment of the frame segments 27a, 27b and minimizes stress on the sealing glass 20, which is prone to damage if the forming method of the leads is not properly accomplished.

Referring again to FIG. 2, a plurality of alignment holes 36 (in this instance, two per lead frame segment 27, are provided for positioning the lead frame segments 27, in an alignment jig (not shown) during assembly. The alignment holes 36 are conventional feature of prior art lead frames. However, as can be appreciated by one skilled in the art, the segmented lead frame 14 of the present invention requires a greater total quantity of alignment holes 36 than does a conventional lead frame.

A great deal of the economy of the best presently known embodiment 10 of the present invention is derived from the fact that all of the lead frame segments 27a, 27b and 27c (as well as the fourth lead frame segment, not shown in the view of FIG. 2) can be identical when originally produced, (either by stamping or by etching). In the presently preferred embodiment 10 of the invention, the lead frame segments 27, are stamped. However, the lead frame segments 27, can also be produced by the etching method.

Figure 3:
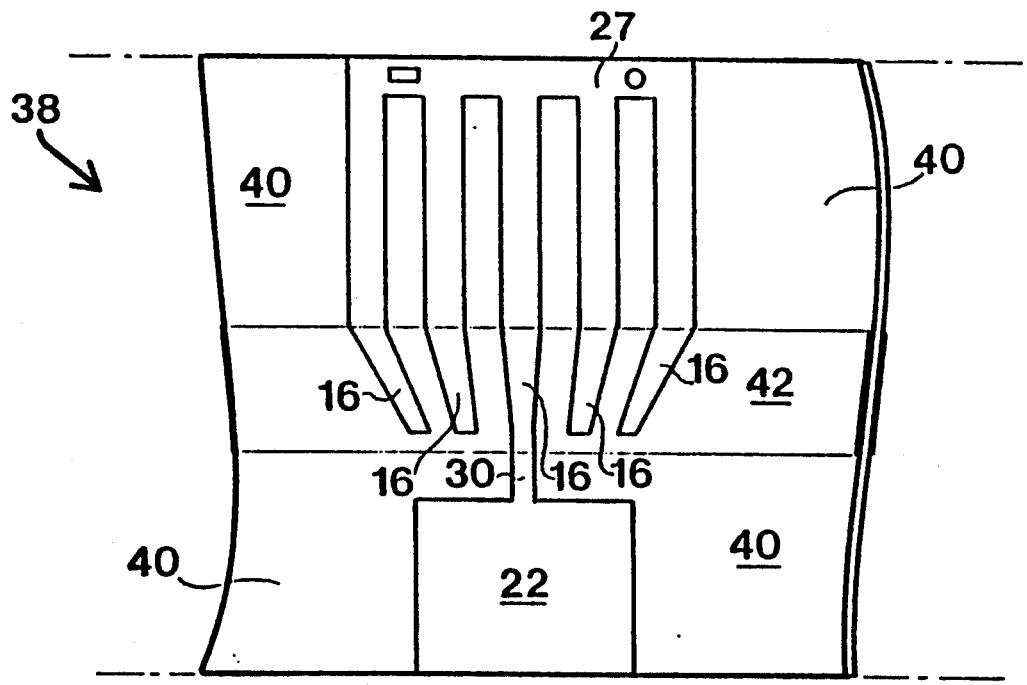
FIG. 3 is a plan view of a section of lead frame material from which a lead frame segment is stamped.

Referring now to FIG. 3, wherein is shown a section of lead frame material strip 38, the lead frame segment 27 is depicted still attached to an excess material portion 40. The lead frame segment 27 is a generic part which, at a later manufacturing stage, can be modified as described herein to become any of the lead frame segments 27a, 27b and 27c since, as has been previously disclosed, each of the lead frame segments 27 are identical as originally produced. The plane 22 and the lead frame extension 30 are also shown in the view of FIG. 3 as being a part of the same lead frame material strip 38. Of course, in many applications, it may well be more practical to produce the plane 22 and the lead frame extension 30 separately and to weld them to the lead frame segment 27, as required. In the present application, the third lead frame segment 27c is not equipped with a plane 22.

An aluminized stripe 42 is placed on the lead frame material strip 38 (by coextrusion or by evaporation) prior to stamping the lead frame segment 27. In the best presently known embodiment 10 of the invention, the aluminized stripe 42 is placed on both sides of the lead frame material strip 38, including that side not visible in the view of FIG. 3. The method for placing the aluminized stripe 42 on the lead the field for use in DIP package configurations. However, prior to the advent of the present inventive segmented lead frame 14 it has been considered impossible to use this technique on quad configuration packages, as aluminization is only acceptable on the aluminized portions 16.

Figure 4:
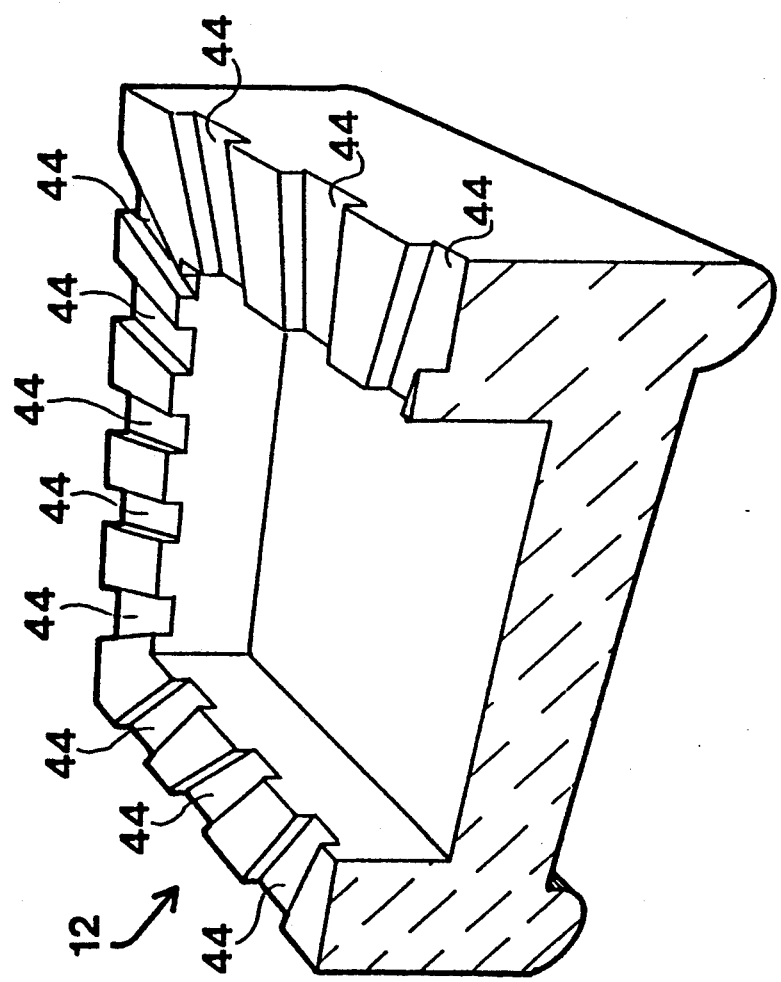
FIG. 4 is a cut away perspective view of a ceramic body, according present invention.

FIG. 4 is a cut away perspective view, similar to that of FIG. 2, showing the ceramic body 12 alone. In this view it can be seen that the ceramic body 12 has a plurality of alignment grooves 44 (in this example, five per side) within which the aluminized portions 16 of the leads 28 rest. While the present invention can be practiced without these alignment grooves 44, the alignment grooves 44 provide an additional means for assuring the proper alignment of the lead frame segments 27 relative to each other. The alignment grooves 44 are not expensive to produce, as the ceramic body 12 is produced by pressing ceramic powders and then firing, and custom forms for pressing the materials can be produced quite inexpensively.

As can be appreciated from the view of FIG. 2, the lead frame segments 27 may be formed such that the planes 22 can be positioned within the ceramic body 12. This has not previously been thought to be possible and, indeed, would not be possible using a single monolithic lead frame assembly (not shown).

Figure 5:
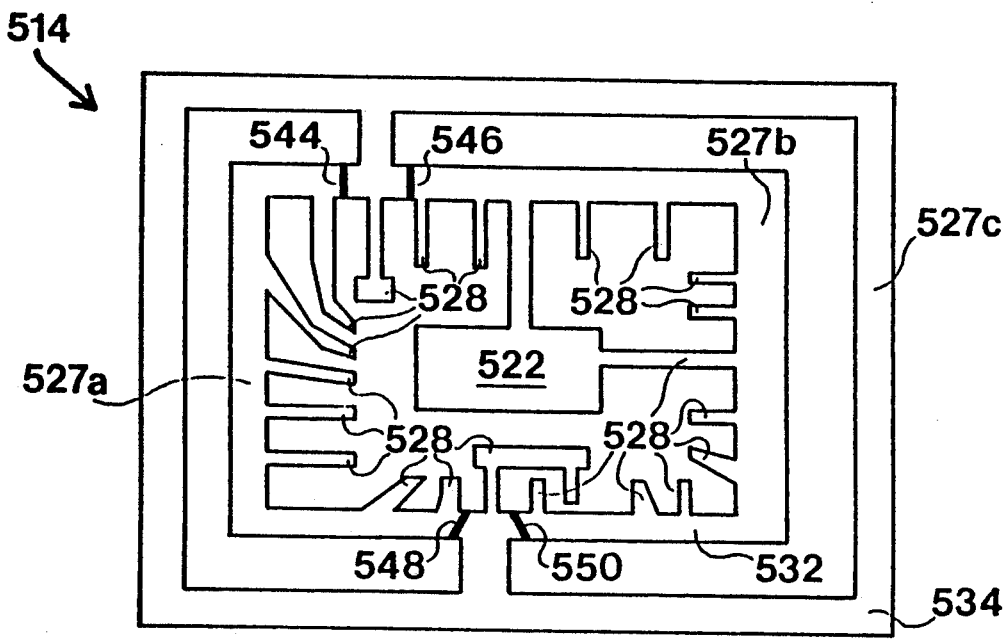
FIG. 5 view of an alternate asymmetrical segmented lead frame, according to the present invention.

An alternate equally preferred segmented lead frame is depicted in FIG. 5 and is designated therein by the general reference character 514. The alternate segmented lead frame 514, like the first preferred embodiment of the segmented lead frame 14 is also for use in the improved package 10 depicted in FIG. 1. However, unlike the first preferred embodiment of the segmented lead frame 14, the example of the alternate segmented lead frame 514 is for use in those applications wherein the lead frame 514 is not symmetrical. The alternate segmented lead frame 514 has an integral plane 522, a plurality (in this instance, twenty three) of individual leads 528, an inner joining strip 532 and an outer joining strip.

Figure 6:
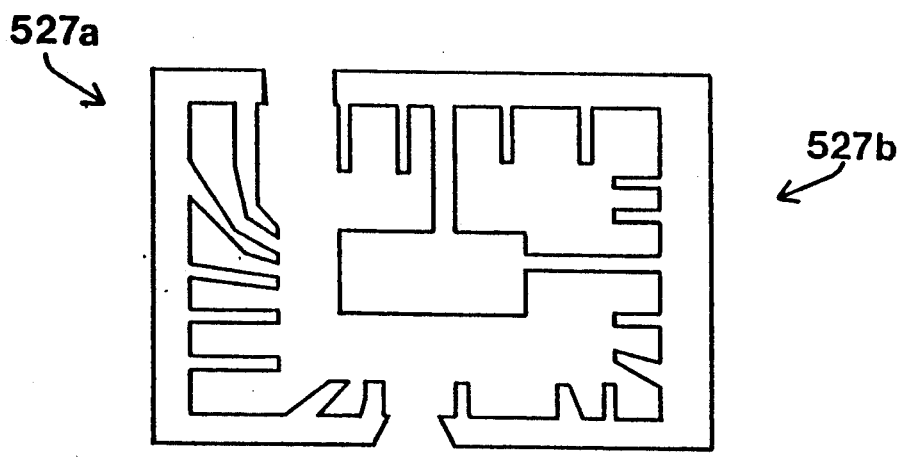
FIG. 6 is a plan view of a first lead frame segment and a second lead frame segment, both of which are cut from the segmented lead frame of FIG. 5.
Figure 7:
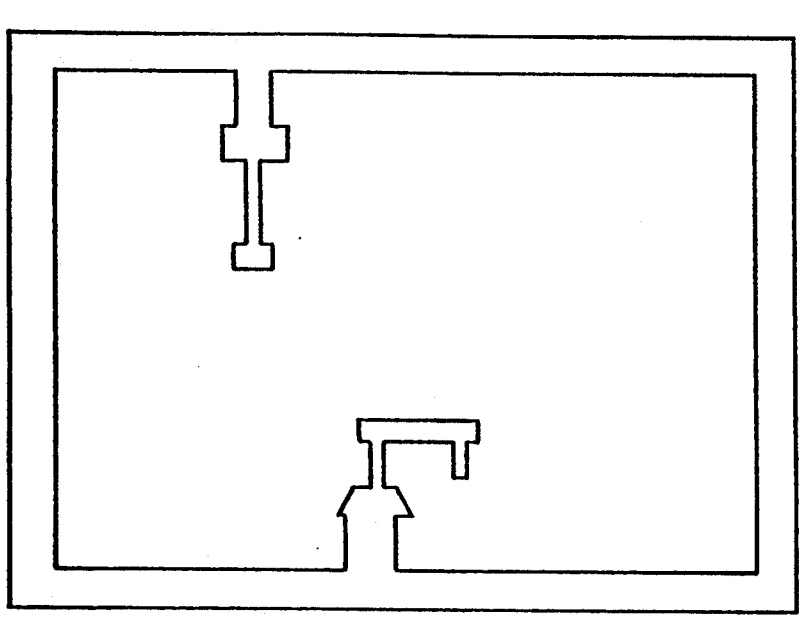
FIG. 7 is a plan view of a third lead frame segment cut from the segmented lead frame of FIG. 5.
Figure 8:
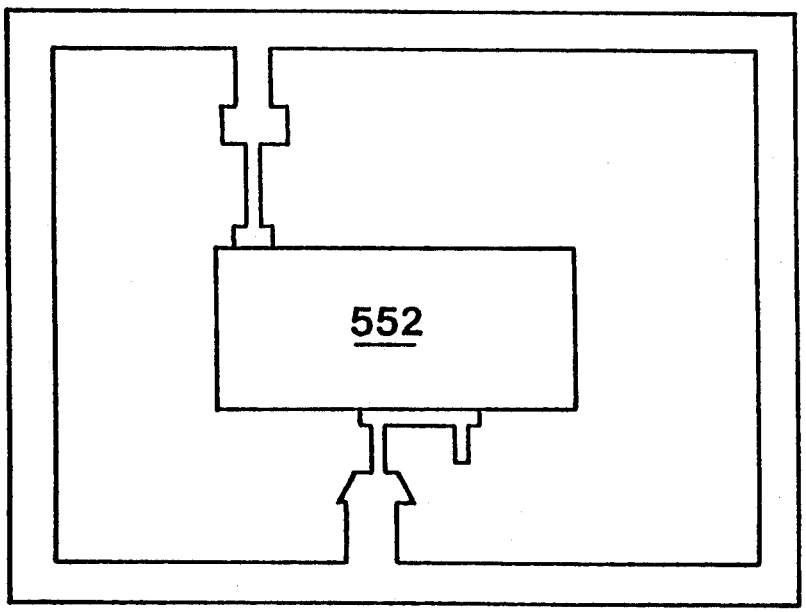
FIG. 8 is a plan view of the third lead frame segment of FIG. 7, the addition of a voltage plane thereto.

After the alternate segmented lead frame 514 is produced, it is cut along a first cutting line 544, a second cutting line 546, a third cutting line 548, and a fourth cutting line 550, dividing the alternate segmented lead frame into three lead frame segments 527. The three resulting lead frame segments are a first lead frame segment 527a and a second lead frame segment 527b, both of which are illustrated in FIG. 6, and a third lead frame segment 527c, illustrated in FIG. 7. Referring now to FIG. 8, a second plane 552 is brazed to the third lead frame segment at the location depicted in FIG. 7. As can be appreciated by one skilled in the art, the resulting three lead frame segments 527 with the two planes 522 and 552 can be utilized as heretofore described in relation to the first preferred embodiment of the segmented lead frame 14. A particular advantage of the alternate segmented lead frame 514 over prior art lead frames, in addition to the previously discussed advantage that the planes 522 and 522 may be included, is that the three lead frame segments 527 are created from a single relatively small portion of lead frame material stock (not shown). This is especially important when the lead frame 514 is to be produced by the etching method because most etching costs are accumulated per sheet of material Therefore, the is the expense per lead frame 514.

The construction shown by the example of the alternate equally preferred lead frame 514 could also be used to advantage when the lead frame 514 is produced by the stamping method. In that instance, all or most of the required segments could be obtained from one combined stamped lead frame (not shown), which would then be cut into segments and rejoined during package assembly.

As is shown above, in great part, the improved semiconductor packages 10 according to the present invention closely resemble prior art conventional semiconductor packages in many respects The substantial difference exists in the inclusion of the segmented lead frame 14 and 514 and related modifications. No significant changes of materials are envisioned nor are any special constructions required.

Various modifications may be made to the invention without altering its value or scope. For example, while the improved semiconductor package described herein is a cerquad type package, other packaging technologies such as plastic type can be used to practice the present invention. Similarly, other pin configurations including but not limited to DIP and chip carrier type pin configurations could be used in practicing the present invention.

Another conceivable change is to practice the present invention without taking full advantage of all of the invention makes possible the use of planes in inexpensive package types, it is not necessary to use planes in a particular application in order to take advantage of the several other benefits available as a result of the segmented lead frames, such as the ability to use inexpensive dies to punch complex lead frames, and the ability to inexpensively aluminize required portions of lead frames for quad packages. Yet another example of the practice of the invention without incorporating all of the features described herein as being a part of the best presently known embodiment thereof would be to omit the positioning grooves and/or the "J" forming ridges described herein. While such features are beneficial, they are not a necessary part of the present invention. All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The improved semiconductor package with segmented lead frame of the present invention is used in the semiconductor industry. The predominant current usages are for packaging those semiconductor devices which require planes and/or any of the other features described herein, but which cannot command a market price sufficient to justify the expense of ceramic co-fired packaging.

The improved semiconductor package of the present invention may be utilized in any application wherein conventional ceramic co-fired packages are used, with the possible exception of those applications which are required to meet certain military specifications. The main area of improvement is in the segmentation of the lead frame. The segmented lead frame of the present invention is appropriate to the current and future needs of the semiconductor industry, wherein the semiconductor chip is becoming more complex. The industry is further requiring stricter standards and more varied configuration of the conducting portions of the package, such as the lead frame. The segmenting and rejoining of the lead frames, according to the present invention, provides a method for producing these varied configurations in an economical manner. The present invention is applicable to cerquad, cerdip, and plastic configurations, as well as to other known configurations and configurations represent the most economical known means of packaging semiconductors, the present invention is thought to be of the greatest utility in the industry.

It is important to note that the several advantages of the present invention combine to produce an economy of manufacture which makes possible the packaging of certain semiconductor components at a price heretofore thought unachievable. While such devices, using prior art methods, certainly could be packaged at a very high price, the economics of the industry has heretofore prevented the production many such devices. The first preferred segmented lead frame 14 as used in the improved package 10 contributes to the economy of production by allowing the use of smaller and far less expensive punching dies and punching machines, by allowing for the use of the planes 22 in plastic and non co-fired ceramic packages, by allowing for the use of the inexpensive aluminized stripe 42 as a means of aluminization even in quad configuration packages, and a combination of these features and related means heretofore discussed. The alternate segmented lead frame 514 is for use in those applications wherein the lead frame 514 is not symmetrical. In such applications, several of the economies described above in relation to the first preferred embodiment of the segmented lead frame 14, such as the ability to produce the lead frame 14 in identical lead frame segments 27a, 27b, and 27c are not possible. However, the alternate segmented lead frame 514 does present several distinct advantages, including the ability to combine the planes 522 and 552 with inexpensive packaging techniques, and the ability to etch the segmented lead frames 514 with maximum economy.

Since the improved lead frame packages with segment lead frames of the present invention may be readily constructed and are physically significantly similar to prior art conventional lead frame packages it is expected that they will be acceptable in the industry as substitutes for the conventional lead frame style packages. For these and other reasons, it is expected that the utility and industrial applicability of the invention will be both significant in scope and long-lasting in duration.

We claim:

1. A method for producing a lead frame for a semiconductor package, comprising:

forming a combined lead frame portion from a portion of lead frame material;

separating the combined lead frame portion into a plurality of lead frame segments wherein one or more of said lead frame segments includes a voltage plane;

assembling the lead frame segments on a package body to form the lead frame; and securing the lead frame segments to said package body to form the lead frame.

2. The method for producing a lead frame of claim 1, wherein:

the combined lead frame portion has about its outer perimeter a lead connecting strip for joining a plurality of individual leads;

each of the lead frame segments so separated retains a portion of said connecting strip such that the individual leads of the lead frame segment are joined by said retained portion of said connecting strip; and said connecting strip is removed from the lead frame segments after final assembly of the semiconductor package.

3. The method for producing a lead frame of claim 1, wherein:

the voltage plane is a ground potential voltage plane.

4. The method for producing a lead frame of claim 1, wherein:

each of said lead frame segments is alike to the other, such that the lead frame formed therewith is substantially symmetrical.

* * * * *